(12) United States Patent
Fu et al.

(10) Patent No.: US 6,534,424 B2
(45) Date of Patent: Mar. 18, 2003

(54) METHOD OF FORMING SILICON NITRIDE ON A SUBSTRATE

(75) Inventors: Tzy-Tzan Fu, Hsinchu (TW); Hung-Chuan Chen, Hsinchu (TW); Chao-Ming Hung, Hsinchu (TW)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/935,138

(22) Filed: Aug. 21, 2001

(65) Prior Publication Data

US 2002/0086541 A1 Jul. 4, 2002

(30) Foreign Application Priority Data

Dec. 29, 2000 (TW) .......................................... 089128359

(51) Int. Cl.$^7$ ......................... H01L 21/31; H01L 21/469
(52) U.S. Cl. ...................................... 438/791; 438/794
(58) Field of Search ................................ 438/791–799

(56) References Cited

U.S. PATENT DOCUMENTS

| | | | | | |
|---|---|---|---|---|---|
| 5,899,752 A | * | 5/1999 | Hey et al. | ................... | 438/791 |
| 6,127,287 A | * | 10/2000 | Hurley et al. | ............... | 438/680 |
| 6,221,794 B1 | * | 4/2001 | Pangrle et al. | .............. | 427/578 |

* cited by examiner

Primary Examiner—Phat X. Cao
Assistant Examiner—Thao X. Le
(74) Attorney, Agent, or Firm—Janah & Associates

(57) ABSTRACT

In a method of forming silicon nitride on a substrate, a substrate is provided in a reaction chamber and a nitrogen-containing gas is introduced into the chamber so that a portion of the nitrogen-containing gas is chemically adsorbed on the substrate surface. Thereafter, the reaction chamber is pumped down to remove the nitrogen-containing gas. A silicon-containing gas is introduced into the reaction chamber to react with the adsorbed nitrogen-containing gas to form a silicon nitride layer on the substrate. Thereafter, the silicon-containing gas may be removed and the cycle repeated to deposit additional silicon nitride layers on the substrate.

32 Claims, 1 Drawing Sheet

METHOD OF FORMING SILICON NITRIDE ON A SUBSTRATE

BACKGROUND

The present invention relates to a method of forming silicon nitride on a substrate.

Silicon nitride ($Si_3N_4$) is a commonly used dielectric material in semiconductor and integrated circuit (IC) fabrication. For example, a silicon nitride layer may be used to prevent moisture and contaminants from entering an IC package, or to prevent mechanical and chemical damage during assembly and packaging of the integrated circuit. In such applications, the silicon nitride is deposited over the entire top surface of a substrate to serve as a passivation layer.

Silicon nitride is also used in certain integrated circuits for special applications. For example, the $E^2PROM$ and Flash memory type integrated circuits use a NO structure to serve as a dielectric layer between floating and control gates. Such applications utilize the high dielectric constant of $Si_3N_4$. Silicon nitride is also used to isolate circuit devices in integrated circuits having tens of thousands of semiconductor devices to allow increased integrated circuit density. The circuit devices are initially formed in the silicon substrate and thereafter electrically isolated with silicon nitride material to ensure proper operation of the devices. $Si_3N_4$ may also be used as a gate spacer because of its good dielectric constant properties.

Typically, silicon nitride is deposited on the substrate by a low pressure chemical vapor deposition (LPCVD) process. In the LPCVD method, a nitrogen-containing gas, such as ammonia ($NH_3$), is reacted in the vapor phase with a silicon-containing gas, such as $SiH_2Cl_2$ or $SiH_4$, to deposit a layer of silicon-nitride on the substrate. For example, when $SiH_2Cl_2$ and $NH_3$ gas are used as the reaction gases in an LPCVD process, it is believed that the chemical reaction is as follows:

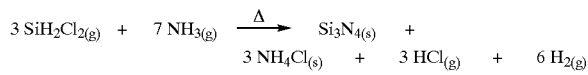

$$3\,SiH_2Cl_{2(g)} + 7\,NH_{3(g)} \xrightarrow{\Delta} Si_3N_{4(s)} + 3\,NH_4Cl_{(s)} + 3\,HCl_{(g)} + 6\,H_{2(g)}$$

However, such conventional silicon deposition methods often result in the deposition of a silicon nitride layer having a non-uniform and variable thickness. These thickness variations may result from differences in the rate of dissociation of the ammonia, $SiH_2Cl_2$ or $SiH_4$ gas, and the loading effect that arises at the sidewalls of trenches in which the silicon nitride is deposited. Thus, it is often difficult to control the thickness uniformity of the deposited silicon nitride film in conventional LPCVD methods, and it is desirable to have a process for depositing silicon nitride material on a substrate with better uniformity and less thickness variability.

SUMMARY

A method of forming silicon nitride material on a substrate, comprises providing a substrate in a reaction chamber, introducing a nitrogen-containing gas into the reaction chamber so that a portion of the nitrogen-containing gas is chemically adsorbed on the substrate surface, pumping down the reaction chamber to remove the nitrogen-containing gas, and introducing a silicon-containing gas into the reaction chamber, wherein the silicon-containing gas reacts with the adsorbed nitrogen-containing gas to form silicon nitride on the substrate.

In another method of forming silicon nitride material, a substrate is provided in a reaction chamber. In a first stage, a nitrogen-containing gas is flowed into the reaction chamber, the flow of the nitrogen-containing gas is stopped, and the reaction chamber is pumped down to remove the nitrogen-containing gas. In a second stage, a silicon-containing gas is flowed into the reaction chamber, the flow of the silicon-containing gas is stopped, and the reaction chamber is pumped down to remove the silicon-containing gas.

DRAWINGS

These features, aspects, and advantages of the present invention will become better understood with regard to the following description, appended claims, and accompanying drawings which illustrate exemplary features of the invention. However, it is to be understood that each of the features can be used in the invention in general, not merely in the context of the particular drawings, and the invention includes any combination of these features where:

DESCRIPTION

Without intending to limit the spirit and scope of the present invention, the exemplary methods and apparatuses described herein are illustrated with reference to forming a silicon nitride film on a substrate. However, it should be understood that one of ordinary skill in the art could apply the method and apparatus for reducing non-uniformity or other thickness problems in the deposition of other materials on substrates, without deviating from the scope of the present invention.

In one exemplary embodiment, silicon nitride is deposited on a substrate using process gases comprising (i) a silicon-containing gas, such as one or more of $SiH_2Cl_2$, $SiH_4$, $Si_2H_6$, or equivalents thereof, and (ii) a nitrogen-containing gas, such as one or more of ammonia ($NH_3$), hydrazine ($N_2H_4$) or equivalents thereof. These gases are separately introduced into the chamber in turns to form a silicon nitride film on the substrate. The thickness of the silicon nitride material on the substrate may be controlled by introducing the two kinds of gases, namely the silicon-containing gas and the nitrogen-containing gas, into the reaction chamber in different turns. Unlike conventional processes that simultaneously introduce the silicon-containing and nitrogen-containing gases into the chamber, for example, the combinations of $NH_3$ and $SiH_2Cl_2$, $NH_3$ and $SiH_4$, $NH_3$ and $Si_2H_6$, or $N_2H_4$ and $SiH_2Cl_2$; in the present process, the controlled surface reaction is obtained by separate introduction of the silicon and nitrogen containing gases, to provide better control of the thickness and uniformity of the deposited films. This method may be used to form single or multiple layers of superimposed silicon nitride films that are each relatively thin to fabricate a film having a controlled and more uniform thickness for a highly integrated semiconductor device.

Figure 1:
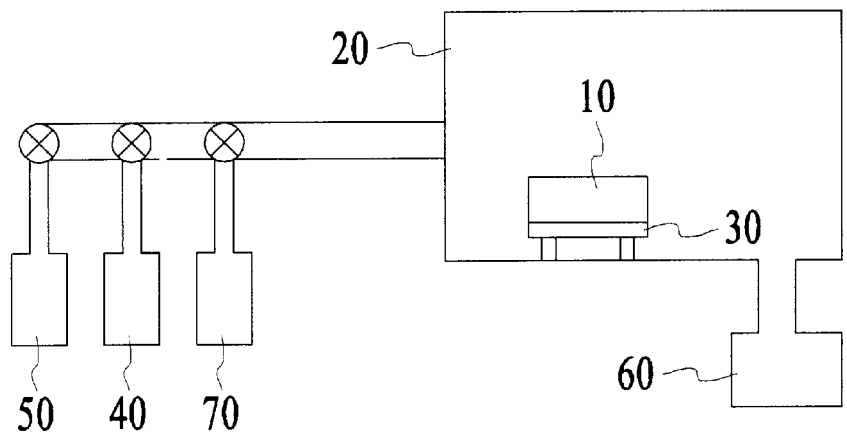
FIG. 1 is a schematic diagram of a reaction chamber according to the present invention.
Figure 2:
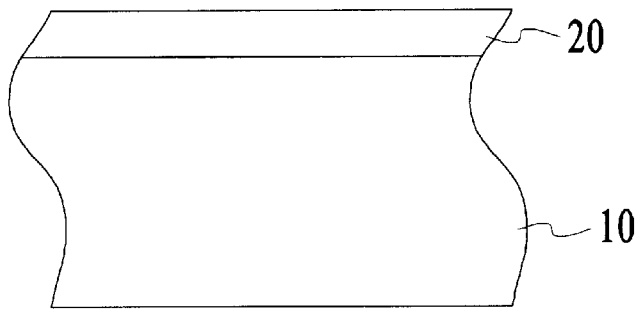
FIG. 2 is a sectional schematic diagram of a substrate comprising a semiconductor wafer having a silicon-nitride film deposited by the present method.

FIG. 1 shows the diagram of an exemplary reaction chamber 20 according to an embodiment of the present invention, in which, a substrate 10 is placed on a base 30 in the reaction chamber 20. The substrate 10 can be, for example, an E²PROM or Flash memory type substrate, that may need, for example, an NO structure to serve as a dielectric layer between a floating and control gate. Typically, a $SiO_2$ layer is located on the top and bottom of the NO structure and a silicon nitride layer is located at the middle of the NO structure. The silicon nitride ($Si_3N_4$) formed by the present process may be also used as a gate spacer to electrically isolate preexisting devices formed in the substrate 10. The gate may also include a silicon nitride ($Si_3N_4$) layer to increase its dielectric constant.

In a first stage, the nitrogen-containing material for fabricating the silicon nitride material on the substrate 10 is obtained from a nitrogen-containing gas. In this stage, the nitrogen-containing gas is introduced into the reaction chamber 20 by a gas pipe 50. A suitable nitrogen-containing gas may be $NH_3$ or $N_2H_4$. After a portion of the nitrogen-containing gas is chemically adsorbed on the substrate surface, the valve on the gas pipe is closed to stop the flow of nitrogen-containing gas. Thereafter, the chamber 20 is pumped down to remove residual or remaining nitrogen-containing gas. Then the chamber 20 is purged with inert gas.

In a second stage, which may be performed before or after the first stage, the silicon material for the silicon nitride film is obtained from a silicon-containing gas that is introduced into the reaction chamber 20 by the gas pipe 40. A chemical reaction between the adsorbed nitrogen-containing gas on the substrate 10 and the silicon-containing gas in the chamber 20 occurs on the surface of the substrate 10. Thereafter, the valve on the gas pipe is closed to stop the silicon-containing gas, the chamber 20 is pumped down to remove remaining silicon-containing gas and then the chamber is purged with inert gas. This cycle forms a silicon nitride film on the substrate 10.

In one example, a nitrogen-containing gas comprising $NH_3$ is introduced into the reaction chamber 20 from the gas pipe 50, at a flow rate of from about 2000 sccm to about 6000 sccm, or even from about 3500 to about 5500 sccm, and preferably at about 4900 sccm. The pump system 60 exhausts the $NH_3$ gas from the reaction chamber 20. The substrate 10 in the reaction chamber 20 may also be heated to predefined temperatures by a heating apparatus (not shown) in the base 30 of from about 450 to about 680° C., and in a preferred version, about 600° C. It is believed that the higher temperatures increase the surface energy of the substrate 10 to provide better surface reactivity of any adsorbed species. The gas pressure in the reaction chamber 20 is from about 100 mTorr to about 150 Torr. A portion of the $NH_3$ gas is chemically adsorbed onto the heated substrate surfaces when the $NH_3$ gas introduced into the chamber. The remaining $NH_3$ gas is pumped out of the reaction chamber 20 by the pump system 20. In this example, the process step for introducing $NH_3$ gas into the reaction chamber is typically performed for less than about 5 seconds.

After the nitrogen gas introducing step, the gas valve is closed to stop the flow $NH_3$ gas and the chamber 20 is pumped down to remove the residual $NH_3$ gas not already adsorbed by the substrate 10. At this point, the surface of the substrate 10 still absorbs $NH_3$ gas. The step of removing the remaining $NH_3$ gas can take at least about two seconds. Next, the reaction chamber 20 is purged with inert gas 70. Typically, the inert gas is Ar or $N_2$ gas, and the purge step also takes less than about 2 seconds.

After the aforementioned steps are completed, a silicon-containing gas is provided into reaction chamber 20 via the gas pipe 40. In one example, the silicon-containing gas is $SiH_4$ in a flow rate of from about 5 sccm to about 50 sccm. In a preferred version, the $SiH_4$ gas flow rate may be set to a rate of from about 10 to about 20 sccm, or even at about 15 sccm. The pump system 60 exhausts the $SiH_4$ gas from the reaction chamber 20. In this step, the substrate 10 having adsorbed $NH_3$ gas on it is also maintained at high temperatures, for example, the aforementioned range of temperatures and more preferably at a temperature of about 600° C., by the heating apparatus (not shown) in the base 30. The pressure in the reaction chamber 20 is maintained at about 20 Torr. Referring to FIG. 1, it is believed that the introduced $SiH_4$ gas reacts with the adsorbed $NH_3$ gas on the surface of substrate 10 to form a silicon nitride film 200. This surface reaction on the substrate 10 is enhanced by the control of the temperature of the substrate 10. The thickness of the silicon nitride film 200 formed on the substrate 10 may be about 2 Angstroms. The $SiH_4$ gas is introduced into the reaction chamber for typically less than about five seconds.

Next, the valve is closed to stop the flow of $SiH_4$ gas into the chamber and the pump system 60 is used to pump down the reaction chamber 20 to remove residual $SiH_4$ gas that has not reacted with the adsorbed $NH_3$ gas on surface of the substrate 10. A silicon nitride film forms on the surface of the substrate 10. The step of removing the remaining $NH_3$ gas can take about two seconds. Thereafter, the reaction chamber 20 is purged with an inert gas 70. A suitable inert gas is Ar or $N_2$ gas, and the purge step typically takes at least about two seconds.

Figure 3:
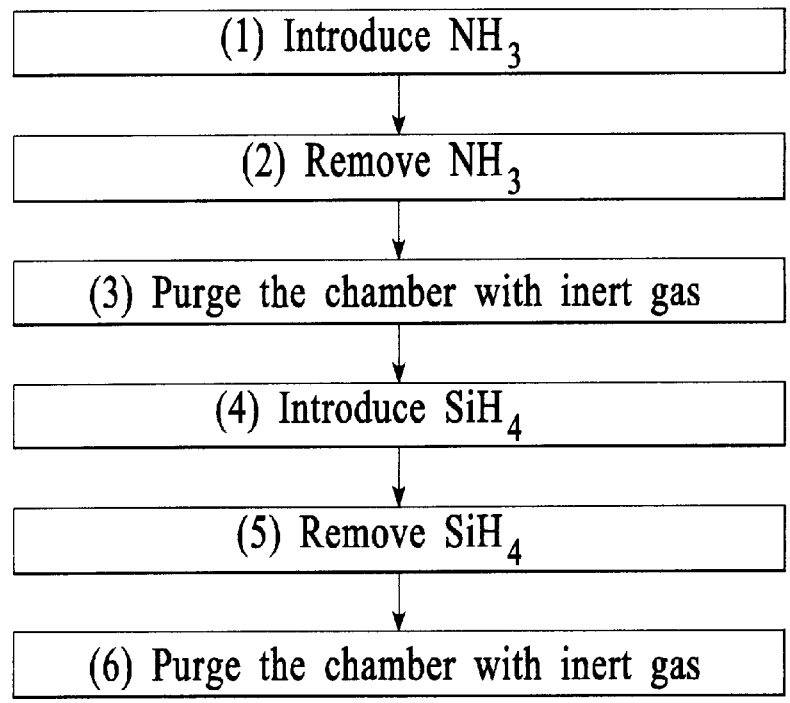
FIG. 3 is a flow chart of a method of fabricating a silicon nitride thin film according to an embodiment of the present invention.

FIG. 3 illustrates a flow chart of an embodiment of a process according to the present invention. As shown, a gas containing elemental nitrogen, such as $NH_3$ or $N_2H_4$, is first provided into the reaction chamber 20 to allow a portion of the nitrogen-containing gas to chemically adsorb onto the substrate surface. The first step can take less than about five seconds. The second step is to close the nitrogen-containing gas flow and pump down the reaction chamber 20 to remove any residual gas that has not been adsorbed by the substrate 10. The second step takes less than about two seconds. The chamber is then purged about two seconds with an inert gas. In the third step, a gas containing elemental silicon, such as $SiH_2Cl_2$, $SiH_4$ or $Si_2H_6$ is provided into the reaction chamber 20 such that a non-vapor phase chemical reaction between the adsorbed nitrogen-containing gas and the silicon-containing gas occurs on the surface of the substrate 10. This step typically takes less than about five seconds. The gas inlet valve is then closed and the reaction chamber 20 is pumped down to remove the remaining silicon-containing gas, at the fifth step, which takes less than about two seconds. The reaction chamber 20 is then purged with inert gas for less than about two seconds at the sixth step. A silicon nitride film having a thickness of about 2 angstroms is formed by this method. The first and second stages of the process may be repeated for a plurality of cycles to form a thicker silicon nitride film whose thickness may be adjusted by controlling the number of process cycle repetitions.

Although the present invention has been described in considerable detail with regard to certain preferred versions thereof, other versions are possible. Also, the apparatus of the present invention can be used in other chambers and for other processes. Therefore, the appended claims should not be limited to the description of the preferred versions contained herein.

What is claimed is:

1. A method of forming silicon nitride material on a substrate, the method comprising:

(a) providing a substrate in a reaction chamber;

(b) introducing a nitrogen-containing gas into the chamber so that a portion of the nitrogen-containing gas is chemically adsorbed on the substrate surface;

(c) after (b), pumping down the reaction chamber to remove the nitrogen-containing gas; and (d) after (c), introducing a deposition gas comprising silicon-containing gas into the reaction chamber, the deposition gas being substantially absent any nitrogen-containing gas, wherein the silicon-containing gas reacts with the adsorbed nitrogen-containing gas to form silicon nitride on the substrate.

2. The method according to claim 1 wherein the nitrogen-containing gas is $NH_3$.

3. The method according to claim 1 wherein the nitrogen-containing gas is $N_2H_4$.

4. The method according to claim 1 wherein the silicon-containing gas is $SiH_2Cl_2$.

5. The method according to claim 1 wherein the silicon-containing gas is $SiH_4$.

6. The method according to claim 1 wherein the silicon-containing gas is $Si_2H_6$.

7. The method according to claim 1 comprising introducing the nitrogen-containing gas into the reaction chamber for less than about five seconds.

8. The method according to claim 1 comprising introducing the silicon-containing gas into the reaction chamber for less than about five seconds.

9. The method according to claim 1 comprising introducing the nitrogen-containing gas into the reaction chamber at a flow rate of from about 2000 sccm to about 6000 sccm.

10. The method according to claim 1 comprising introducing the silicon-containing gas into the reaction chamber at a flow rate of from about 5 sccm to about 50 sccm.

11. The method according to claim 1 comprising maintaining the gas in the reaction chamber at a pressure of from about 100 mTorr to about 150 Torr.

12. The method according to claim 1 comprising maintaining the temperature of the substrate at from about 450° C. to about 680° C.

13. The method according to claim 1 further comprising (e) pumping down the reaction chamber to remove the nitrogen-containing or silicon-containing gas.

14. The method according to claim 13 comprising purging the reaction chamber with an inert gas after pumping down the chamber.

15. The method according to claim 13 comprising repeating steps (b) through (e) for a plurality of cycles until a desired thickness of the silicon nitride is formed.

16. The method according to claim 1 wherein (d) comprises introducing a deposition gas comprising silicon-containing gas without any nitrogen-containing gas into the reaction chamber.

17. The method according to claim 1 wherein (d) comprises introducing a deposition gas consisting essentially of silicon-containing gas into the reaction chamber.

18. A method of forming silicon nitride material on a substrate, the method comprising:

(a) providing a substrate in a reaction chamber;

(b) in a first stage, flowing a nitrogen-containing gas into the reaction chamber, stopping the flow of the nitrogen-containing gas, and pumping down the reaction chamber to remove the nitrogen-containing gas; and (c) subsequently, in a second stage, flowing substantially only silicon-containing gas into the reaction chamber, stopping the flow of the silicon-containing gas, and pumping down the reaction chamber to remove the silicon-containing gas.

19. The method according to claim 18 comprising purging the reaction chamber with an inert gas after one or more of steps (b) and (c).

20. The method according to claim 18 comprising repeating the first and second stages for a plurality of cycles until a desired thickness of the silicon nitride is formed.

21. The method according to claim 18 wherein the nitrogen-containing gas is $NH_3$.

22. The method according to claim 18 wherein the nitrogen-containing gas is $N_2H_4$.

23. The method according to claim 18 wherein the silicon-containing gas is $SiH_2Cl_2$.

24. The method according to claim 18 wherein the silicon-containing gas is $SiH_4$.

25. The method according to claim 18 wherein the silicon-containing gas is $Si_2H_6$.

26. The method according to claim 18 comprising introducing the nitrogen-containing gas into the reaction chamber for less than about five seconds.

27. The method according to claim 18 comprising introducing the silicon-containing gas into the reaction chamber for less than about five seconds.

28. The method according to claim 18 comprising introducing the nitrogen-containing gas into the reaction chamber at a flow rate of from about 3500 sccm to about 5500 sccm.

29. The method according to claim 18 comprising introducing the silicon-containing gas into the chamber at a flow rate of from about 10 sccm to about 20 sccm.

30. The method according to claim 18 comprising maintaining the gas in the reaction chamber at a pressure of from about 100 mTorr to about 150 Torr.

31. The method according to claim 18 comprising maintaining the temperature of the substrate at from about 450° C. to about 680° C.

32. The method of claim 18 wherein (c) comprises flowing substantially only silicon-containing gas without any nitrogen-containing gas into the reaction chamber.

* * * * *